(12) United States Patent
McNeil et al.

(10) Patent No.: US 8,387,464 B2
(45) Date of Patent: Mar. 5, 2013

(54) LATERALLY INTEGRATED MEMS SENSOR DEVICE WITH MULTI-STIMULUS SENSING

(75) Inventors: Andrew C. McNeil, Chandler, AZ (US); Yizhen Lin, Gilbert, AZ (US); Woo Tae Park, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 631 days.

(21) Appl. No.: 12/627,679

(22) Filed: Nov. 30, 2009

(65) Prior Publication Data

US 2011/0126632 A1    Jun. 2, 2011

(51) Int. Cl.
 *G01L 9/12* (2006.01)
(52) U.S. Cl. ............................................. 73/718; 73/777
(58) Field of Classification Search ............... 73/715, 73/718, 724, 777
See application file for complete search history.

(56) References Cited

U.S. PATENT DOCUMENTS

| | | | | |
|---|---|---|---|---|
| 6,914,323 | B2 * | 7/2005 | Curtis et al. | 257/682 |
| 7,302,848 | B2 * | 12/2007 | Kourepenis et al. | 73/504.16 |
| 7,671,710 | B2 * | 3/2010 | Yoshida et al. | 334/6 |
| 8,049,287 | B2 * | 11/2011 | Combi et al. | 257/416 |
| 8,216,882 | B2 * | 7/2012 | Lin et al. | 438/113 |
| 8,229,139 | B2 * | 7/2012 | Pahl | 381/150 |
| 2008/0022777 | A1 | 1/2008 | Tan et al. | |

OTHER PUBLICATIONS

Knese et al., Novel Technology for Capacitive Pressure Sensors With Monocrystalline Silicon Membranes, IEEE, 2009, pp. 697-700.

* cited by examiner

*Primary Examiner* — Max Noori
(74) *Attorney, Agent, or Firm* — Schmeiser, Olsen & Watts LLP; Lowell W. Gresham; Charlene R. Jacobsen

(57) ABSTRACT

A microelectromechanical systems (MEMS) sensor device (20) includes a substrate (22) having sensors (24, 26) disposed on the same side (28) of the substrate (22) and laterally spaced apart from one another. The sensor (26) includes a sense element (56), and the substrate (22) includes a cavity (58) extending through the substrate (22) from the backside (30) of the substrate (22) to expose the sense element (56) to an external environment (54). The sense element (56) is movable in response to a stimulus (52) from the environment (54) due to its exposure to the environment (54) via the cavity (58). Fabrication methodology (66) entails concurrently forming the sensors (24, 26) on substrate (22) by implementing MEMS process flow, followed by creating the cavity (58) through the substrate (22) to expose the sense element (56) to the environment (54).

19 Claims, 6 Drawing Sheets

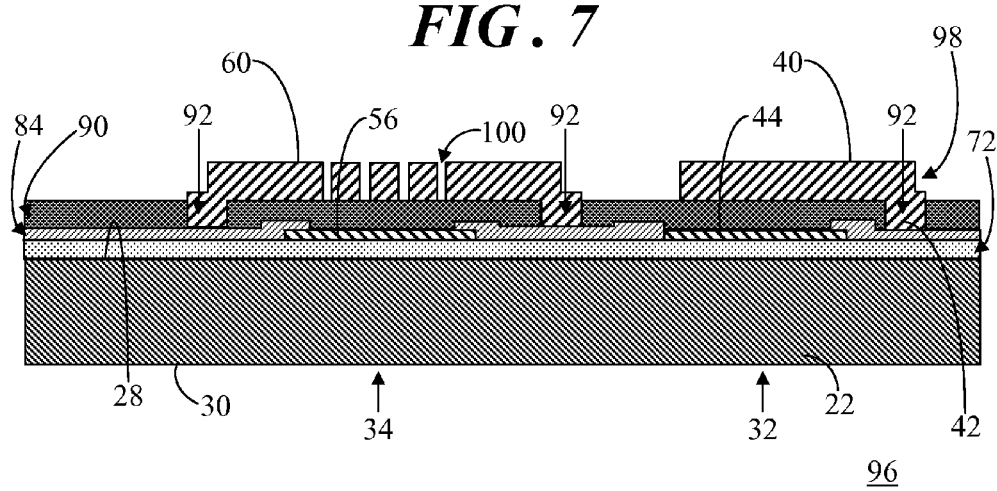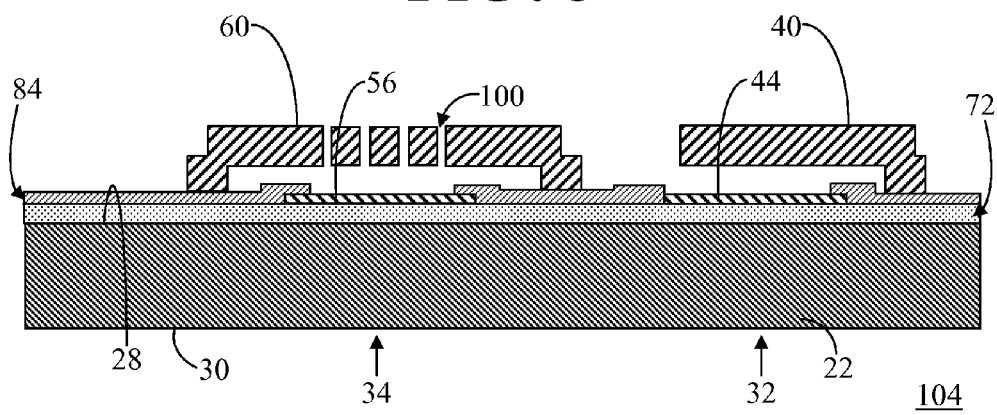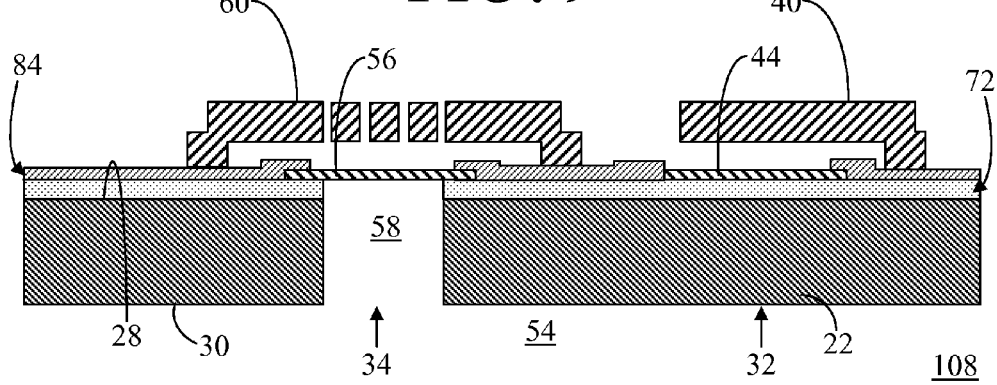

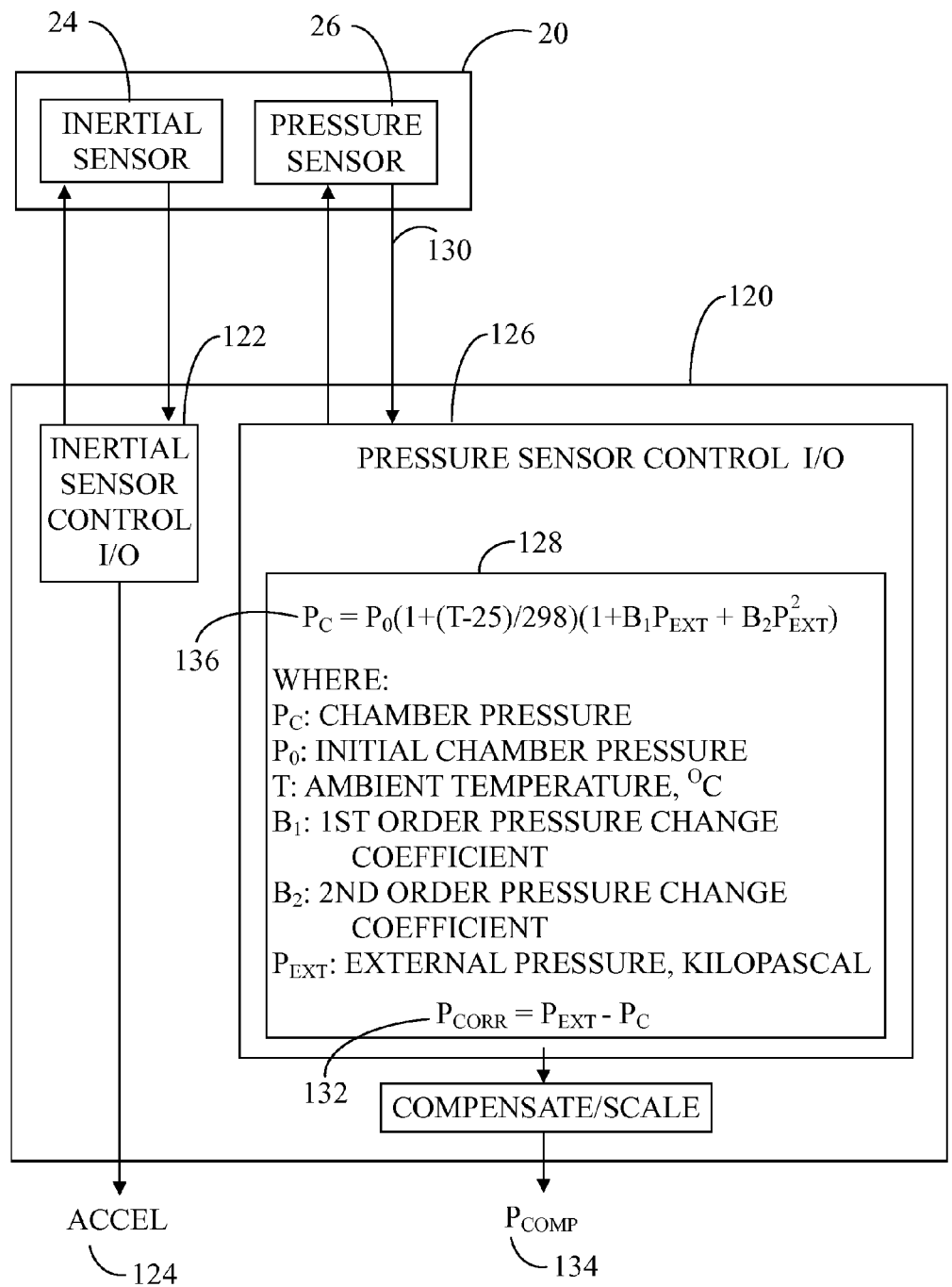

LATERALLY INTEGRATED MEMS SENSOR DEVICE WITH MULTI-STIMULUS SENSING

TECHNICAL FIELD OF THE INVENTION

The present invention relates generally to microelectromechanical (MEMS) sensor devices. More specifically, the present invention relates to a laterally integrated MEMS sensor device with multiple stimulus sensing capability.

BACKGROUND OF THE INVENTION

Microelectromechanical systems (MEMS) devices are semiconductor devices with embedded mechanical components. MEMS devices include, for example, pressure sensors, accelerometers, gyroscopes, microphones, digital mirror displays, micro fluidic devices, and so forth. MEMS devices are used in products such as automobile airbag systems, control applications in automobiles, navigation, display systems, inkjet cartridges, and so forth. Capacitive-sensing MEMS accelerometer designs are highly desirable for operation in high gravity environments and in miniaturized devices due to their relatively low cost.

As the uses for MEMS sensor devices continue to grow and diversify, there is an increasing need for MEMS sensor products in which various sensors capable of sensing different physical stimuli are integrated into the same package. For example, increasing emphasis is being placed on the development of advanced silicon pressure sensors and silicon accelerometers. These efforts are primarily driven by existing and potential high-volume applications in automotive, medical, commercial, and consumer products.

Accordingly, there is a continuing need for an improved MEMS sensor device capable of sensing different physical stimuli, such as pressure and acceleration, and fabrication methodology that achieves efficient die area size without increasing manufacturing cost or sacrificing part performance.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 7 shows a side view of the device of FIG. 6 in a subsequent stage of processing;

FIG. 8 shows a side view of the device of FIG. 7 in a subsequent stage of processing;

FIG. 9 shows a side view of the device of FIG. 8 in a subsequent stage of processing;

FIG. 12 shows a schematic illustration of the MEMS sensor device of FIG. 1 coupled with a control input/output circuit.

DETAILED DESCRIPTION

An embodiment of the invention entails a microelectromechanical systems (MEMS) sensor device capable of sensing different physical stimuli. In particular, the MEMS sensor device includes laterally spaced integrated sensors, each of which may sense a different physical stimulus. In an embodiment, one sensor of the MEMS sensor device may sense linear acceleration and the other sensor of the MEMS sensor device may sense pressure. Another embodiment of the invention entails a method for fabricating the MEMS sensor device on a single substrate using MEMS process steps with an additional backside cavity etch through the substrate. The fabrication methodology yields a MEMS sensor device with multiple stimulus sensing capability that has good performance, is durable, and is low cost. In addition, the MEMS sensor device achieves the additional advantages of small size and low power consumption.

Figure 1:
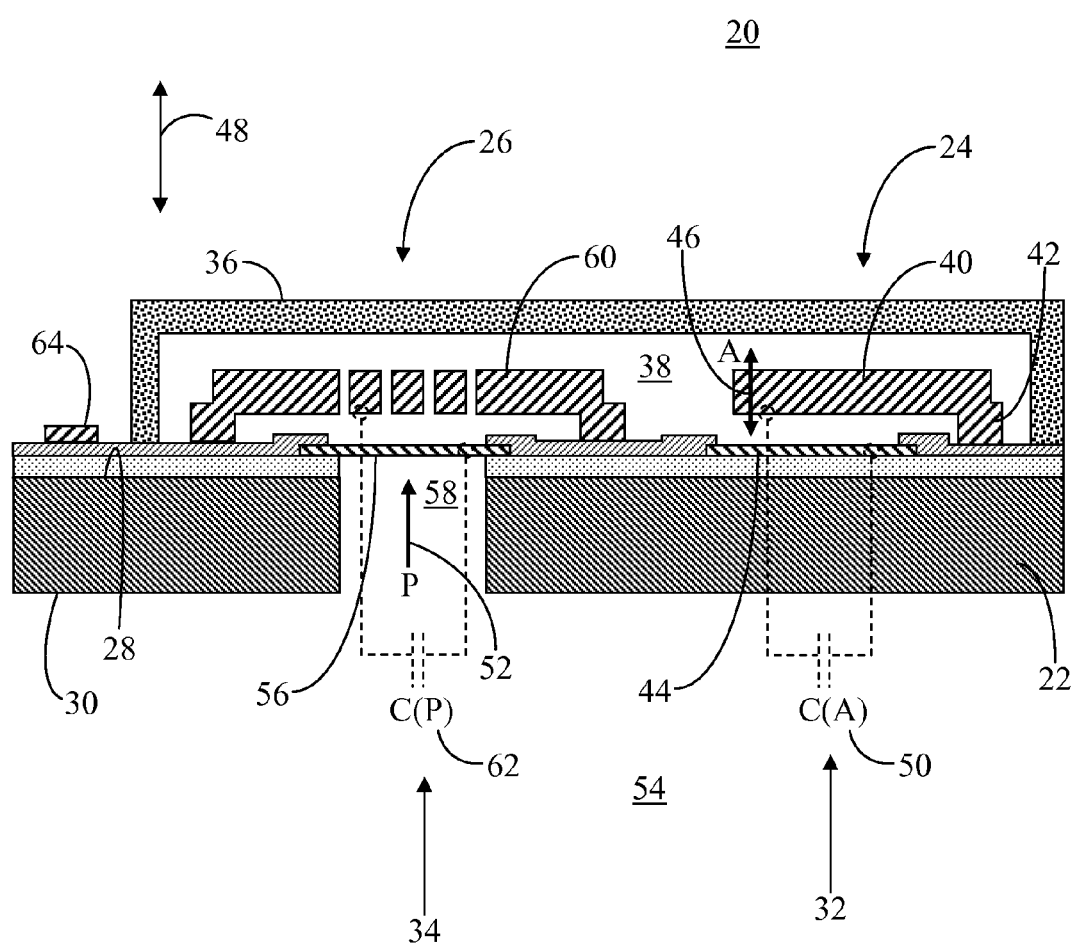
FIG. 1 shows a sectional side view of a microelectromechanical systems (MEMS) sensor device in accordance with an embodiment.

FIG. 1 shows a sectional side view of a microelectromechanical systems (MEMS) sensor device 20 in accordance with an embodiment. FIG. 1 and subsequent FIGS. 3-10 are illustrated using various shading and/or hatching to distinguish the different elements of MEMS sensor device 20, as will be discussed below. These different elements within the structural layers may be produced utilizing current and upcoming surface micromachining techniques of depositing, patterning, etching, and so forth.

MEMS sensor device 20 includes a substrate 22, a first sensor 24, and a second sensor 26. Substrate 22 includes a first side 28 and a second side 30 that opposes first side 28. First sensor 24 is disposed on first side 28 of substrate 22 at a first location 32, and second sensor 26 is disposed on first side 28 of substrate 22 at a second location 34 that is laterally displaced from first location 32. A cap 36 is coupled with first side 28 of substrate 22 to form a hermetically sealed chamber 38 in which both first sensor 24 and second sensor 26 are located. The terms "first" and "second" used herein do not refer to an ordering or prioritization of elements within a countable series of elements. Rather, the terms "first" and "second" are used to distinguish the particular elements for clarity of discussion.

In an embodiment, first sensor 24 is an inertial sensor configured to sense motion. As such, first sensor 24 is referred to hereinafter as inertial sensor 24. In this exemplary scenario, first sensor 24 is a linear accelerometer having a movable element, referred to herein as a proof mass 40, suspended above first side 28 of substrate 22. In an embodiment, proof mass 40 is a cantilevered beam that is anchored to substrate 22 via an anchor 42. A sensing element, in the form of an electrode element 44, may be disposed on first side 28 of substrate 22 beneath proof mass 40 at first location 32. Proof mass 40 moves or deflects in response to linear acceleration (A), represented by a bi-directional arrow 46, in a direction 48 that is perpendicular to a plane of substrate 22, i.e., first side 28 of substrate 22. Movement of proof mass 40 is sensed by electrode element 44. A change in a capacitance 50, C(A), between electrode element 44 and proof mass 40 as a function of acceleration 46 can be registered by sense circuitry (not shown) and converted to an output signal representative of the acceleration 46.

Although inertial sensor 24 is presented as a single axis linear accelerometer, it should be understood that in alternative embodiments, inertial sensor 24 may be configured to sense linear motion in more than one direction and/or may be configured to sense angular or rotational movement. In still other embodiments, first sensor 24 may be configured for other physical stimuli, such as a magnetic field sensing, optical sensing, electrochemical sensing, and so forth.

In an embodiment, second sensor 26 is a pressure sensor configured to sense a pressure stimulus (P), represented by an arrow 52, of an environment 54 that is external to MEMS sensor device 20. As such, second sensor 26 is referred to hereinafter as pressure sensor 26. Pressure sensor 26 includes a sense element, referred to herein as a diaphragm 56, and substrate 22 includes a cavity 58 at second location 26 that extends through substrate 22 from second side 30 of substrate 22. Diaphragm 56 is exposed to external environment 54 via cavity 58. Although a pressure sensor is discussed herein, in alternative embodiments, any sensor that utilizes a relatively thin structure similar to diaphragm 56, for example, a microphone, may be implemented in lieu of the pressure sensor.

Pressure sensor 26 further includes a reference element 60 spaced apart from first side 28 of substrate 22 and overlying diaphragm 56. Diaphragm 56 is capable of movement in direction 48 that is generally perpendicular to a plane of substrate 22, i.e., first side 28 of substrate 22, in response to pressure stimulus 52. Pressure sensor 26 senses pressure stimulus 52 from environment 54 as movement of diaphragm 56 relative to reference element 60. A change in a capacitance 62, C(P), between reference element 60 and diaphragm 56 as a function of pressure stimulus 52 can be registered by sense circuitry (not shown) and converted to an output signal representative of pressure stimulus 52. Reference element 60 of pressure sensor 26 serves an additional function. That is, reference element 60 overlying diaphragm 56 functions as an over-travel stop that limits movement of diaphragm 56 in direction 48 when MEMS sensor device 20 is subjected to hard conditions in direction 48 so as to prevent damage to diaphragm 56 and/or to prevent erroneous signals.

MEMS sensor device 20 may additionally include one or more internal connection sites (not shown), conductive traces (not shown), and/or one or more external connection sites 64 (of which one is shown) that may be formed concurrently with other components of MEMS sensor device 20.

Figure 2:
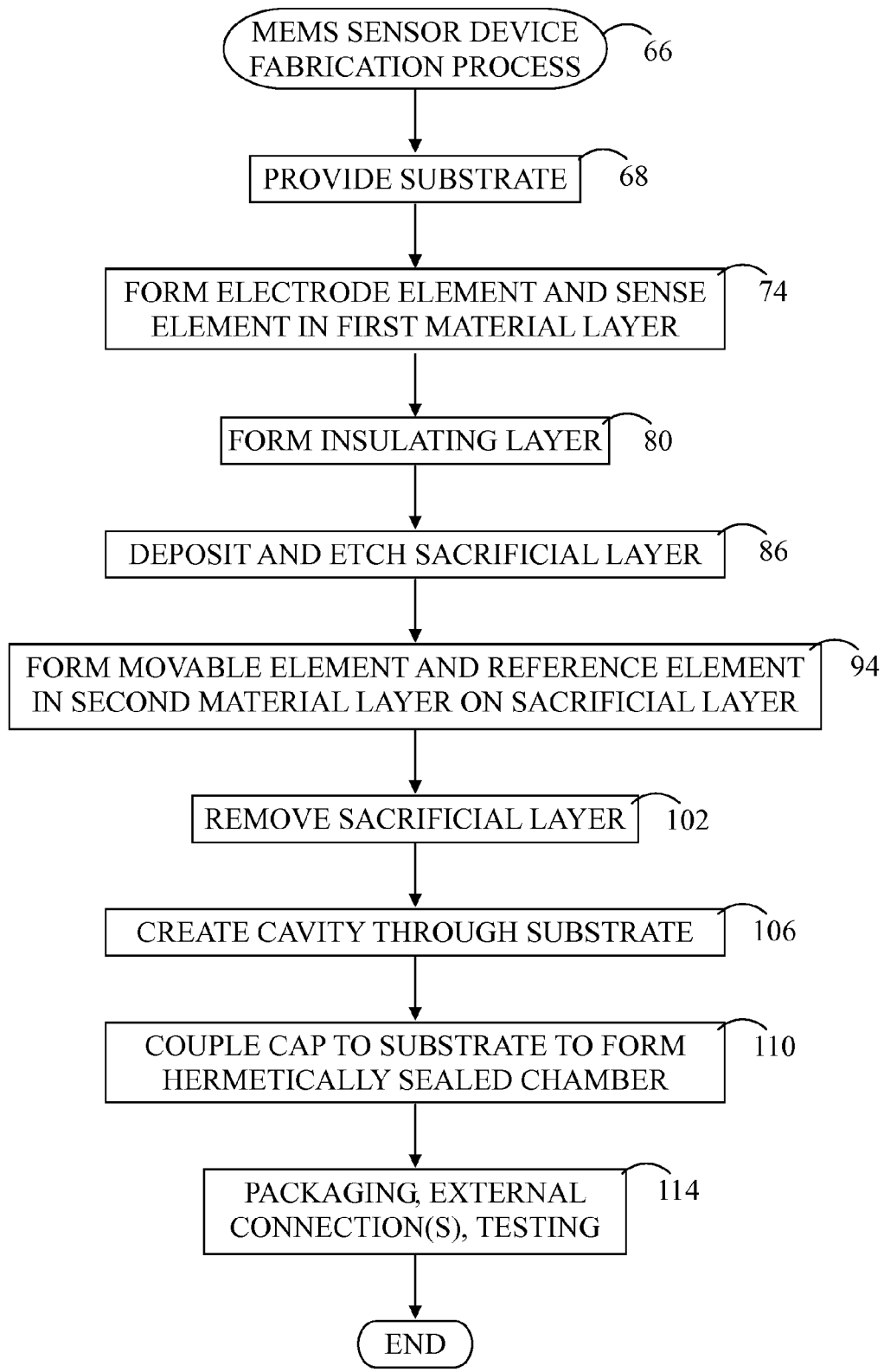
FIG. 2 shows a flowchart of a fabrication process for producing the MEMS sensor device of FIG. 1 in accordance with another embodiment.

FIG. 2 shows a flowchart of a fabrication process 66 for producing the MEMS sensor device 20 (FIG. 1) in accordance with another embodiment. Process 66 generally describes methodology for concurrently forming the elements of the laterally spaced sensors 24 and 26 and an ensuing cavity formation operation to provide cavity 58 (FIG. 1). The concurrent formation of sensors 24 and 26 enables the implementation of known and developing MEMS bulk micromachining technologies to yield MEMS sensor device 20 that cost effectively achieves efficient die area size without sacrificing part performance. Fabrication process 66 is described below in connection with the fabrication of a single MEMS sensor device 20. However, it should be understood by those skilled in the art that the following process allows for concurrent wafer-level manufacturing of a plurality of MEMS sensor devices 20. The individual devices 20 can then be cut, or diced, in a conventional manner to provide individual MEMS sensor devices 20 that can be packaged and integrated into an end application.

MEMS sensor device fabrication process 66 begins with an activity 68. At activity 68, substrate 22 is provided. In an embodiment, substrate 22 may be provided with an insulating layer, such as, for example silicon oxide.

Figure 3:
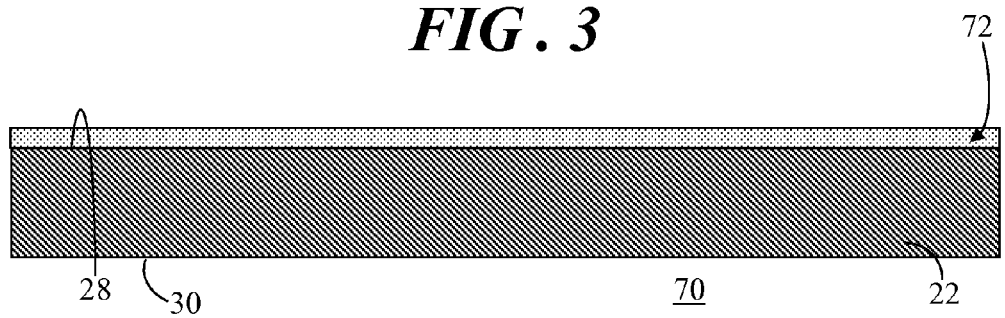
FIG. 3 shows a side view of the device of FIG. 1 in a beginning stage of processing.

Referring to FIG. 3 in connection with activity 68, FIG. 3 shows a side view of MEMS sensor device 20 (FIG. 1) in a beginning stage 70 of processing in accordance with activity 68. At beginning stage 70, substrate 22, such as a silicon wafer, is provided. Substrate 22 may be provided with a blanket insulating layer of, for example, silicon oxide 72, from a wafer provider. Silicon oxide 72 may be formed on substrate 22 by performing a local oxidation of silicon LOCOS) microfabrication process. Alternatively, substrate 22 may be provided from an outside provider. Following receipt of substrate 22, silicon oxide 72 may then be formed on substrate 22 by the manufacturing facility fabricating MEMS sensor device 20. In this illustration, a small stipple pattern is utilized to represent silicon oxide layer 72.

With reference back to MEMS sensor device fabrication process 66 (FIG. 2), following activity 68, an activity 74 is performed. At activity 74, a first material layer is formed over silicon oxide layer 72 to produce at least electrode element 44 (FIG. 1) of inertial sensor 24 (FIG. 1) and diaphragm 56 (FIG. 1) of pressure sensor 26 (FIG. 1).

Figure 4:
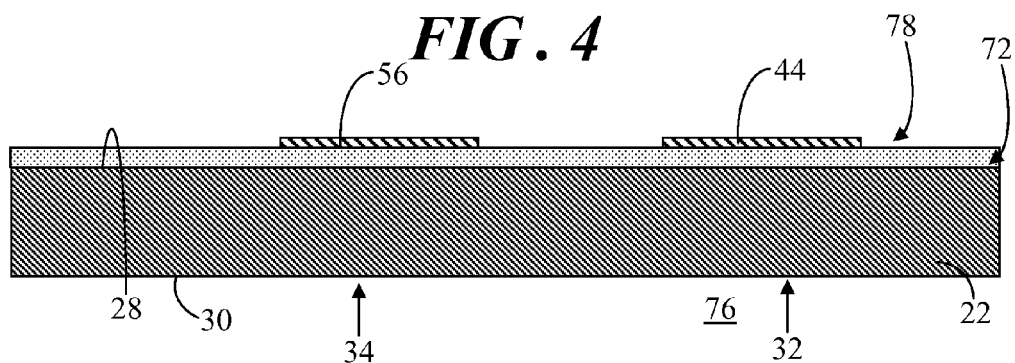
FIG. 4 shows a side view of the device of FIG. 3 in a subsequent stage of processing.

Referring to FIG. 4 in connection with activity 74, FIG. 4 shows a side view of the device of FIG. 3 in a subsequent stage 76 of processing. At stage 76, material such as polysilicon is deposited on silicon oxide layer 72 to form a first material layer 78. First material layer 78 is patterned and etched to concurrently form electrode element 44 at first location 32 and diaphragm 56 at second location 34. In this illustration, a rightwardly and downwardly directed wide hatch pattern is utilized to represent first material layer 78.

With reference back to MEMS sensor device fabrication process 66 (FIG. 2), following activity 74, an activity 80 is performed. At activity 80, an insulating or dielectric layer is formed.

Figure 5:
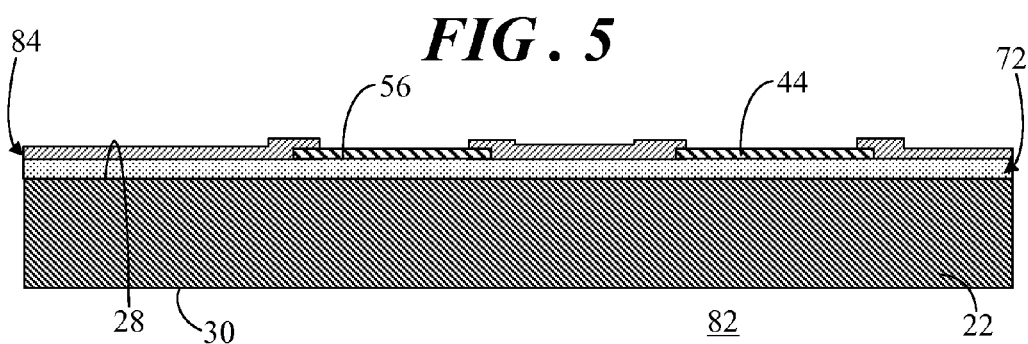
FIG. 5 shows a side view of the device of FIG. 4 in a subsequent stage of processing.

Referring to FIG. 5 in connection with activity 80, FIG. 5 shows a side view of the device of FIG. 4 in a subsequent stage 82 of processing. At stage 82, insulating material such as a silicon nitride layer 84, is deposited, patterned, and etched to overlie silicon oxide layer 72 and portions of each of electrode element 44 and diaphragm 56. Silicon nitride layer 84 functions to electrically isolate electrode element 44 and diaphragm 56 from one another and from other elements of MEMS sensor device 20. In this illustration, a rightwardly and upwardly directed narrow hatch pattern is utilized to represent silicon nitride layer 84.

With reference back to MEMS sensor device fabrication process 66 (FIG. 2), following activity 80, an activity 86 is performed. At activity 86, a first sacrificial layer is deposited over silicon nitride layer 84, electrode element 44, and diaphragm 56.

Figure 6:
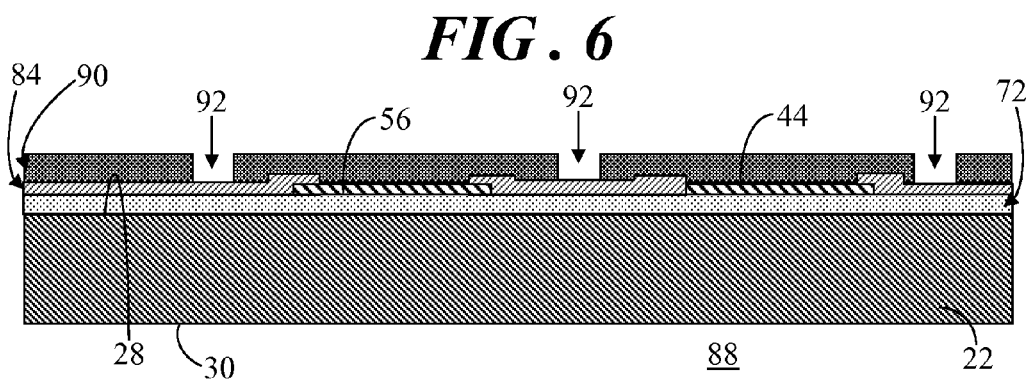
FIG. 6 shows a side view of the device of FIG. 5 in a subsequent stage of processing.

Referring to FIG. 6 in connection with activity 86, FIG. 6 shows a side view of the device of FIG. 5 in a subsequent stage 88 of processing. As shown, a sacrificial layer 90, for example, phosphosilicate glass (PSG), is deposited over silicon nitride layer 84, electrode element 44, and diaphragm 56. Openings 92 may be etched at predetermined locations for the eventual fabrication of anchor 42 (FIG. 1) and the fabrication of reference element 60 (FIG. 1) attached to first side 28 of substrate 22.

With reference back to MEMS sensor device fabrication process 66 (FIG. 2), following activity 86, an activity 94 is performed. At activity 94, a second material layer is formed over sacrificial layer 90 to produce at least proof mass 40

(FIG. 1) of inertial sensor 24 (FIG. 1) and reference element 60 of pressure sensor 26 (FIG. 1).

Referring to FIG. 7 in connection with activity 94, FIG. 7 shows a side view of the device of FIG. 6 in a subsequent stage 96 of processing. At stage 96, material such as polysilicon, is deposited on sacrificial layer 90 to form a second material layer 98. Second material layer 98 is appropriately patterned and etched to concurrently form anchor 42 and proof mass 40 at first location 32, and to form reference element 60 at second location 34. It should be observed that openings 92 are filled with polysilicon of second material layer 98 to attach anchor 42 and reference element 60 to first side 28 of substrate 22. It should further be observed that reference element 60 and/or proof mass 40 may include through-holes 100 extending through them. These through-holes 100 can effectively make reference element 60 and/or proof mass 40 porous thus enabling passage of an etch material, or etchant, in order to remove the underlying sacrificial layer 90 at a subsequent processing activity. In this illustration, a rightwardly and upwardly directed wide hatch pattern is utilized to represent second material layer 98.

With reference back to MEMS sensor device fabrication process 66 (FIG. 2), following activity 94, an activity 102 is performed. At activity 102, proof mass 40 and reference element 60 are suspended over first side 28 of substrate 22 by removing sacrificial layer 90 employing, for example, an etching technique.

Referring to FIG. 8 in connection with activity 102, FIG. 8 shows a side view of the device of FIG. 7 in a subsequent stage 104 of processing. At stage 104, sacrificial layer 90 is etched using known processes to generally release proof mass 40 and reference element 60 from the underlying first side 28 of substrate 22, excluding their attachment points to substrate 22. In an embodiment, the etching of sacrificial layer 90 at activity 102 removes substantially an entirety of sacrificial layer 90 so that proof mass 40 and reference element 60 are spaced apart from respective ones of electrode element 44 and diaphragm 56. With the removal of sacrificial layer 90 at task 102, proof mass 40 is free to move in response to acceleration 46 (FIG. 1) in direction 48 (FIG. 1).

The removal of sacrificial layer 90 can be achieved by making certain regions of proof mass 40 and/or reference element 60 porous to the etchant by fabricating through-holes 100, as mentioned above. Through-holes 100 can provide passage through which an etchant can pass to reach the underlying sacrificial layer 90. This porosity may alternatively be accomplished by the properties of the material used to fabricate proof mass 40 and reference element 60. For example, the properties of the material may be such that the etchant can permeate through the material of proof mass 40 and reference element 60 to reach the underlying sacrificial layer 90 without damage to proof mass 40 and reference element 60.

With reference back to MEMS sensor device fabrication process 66 (FIG. 2), following activity 102, an activity 106 is performed. At activity 106, cavity 58 (FIG. 1) is created through substrate 22.

Referring to FIG. 9 in connection with activity 106, FIG. 9 shows a side view of the device of FIG. 8 in a subsequent stage 108 of processing. At stage 108, cavity 58 is formed by etching through substrate 22 from second side 30 of substrate. An optional activity may first be performed to deposit a photoresist material over the structures disposed on first side 28 of substrate 22 to protect those structures while cavity 58 is being created.

In an embodiment, cavity 58 may be created by performing a deep-reactive ion etch (DRIE) process, another anisotropic etch process, a silicon etch process, or the like to form the deep, steep-sided cavity 58 in substrate 22. Such an etch process may not remove silicon oxide layer 72. Consequently, a subsequent known or developing etch operation may be called for to remove silicon oxide layer 72 from the backside of diaphragm 56 so that diaphragm 56 is exposed to environment 54. With the removal of sacrificial layer 90 at task 102 and the creation of cavity 58 at task 106, diaphragm 56 is free to move in direction 48 (FIG. 1) in response to external pressure stimulus 52 (FIG. 1).

With reference back to MEMS sensor device fabrication process 66 (FIG. 2), following activity 106, an activity 110 is performed. At activity 110, cap 36 (FIG. 1) is coupled to substrate 22 to form hermetically sealed chamber 38 (FIG. 1).

Figure 10:
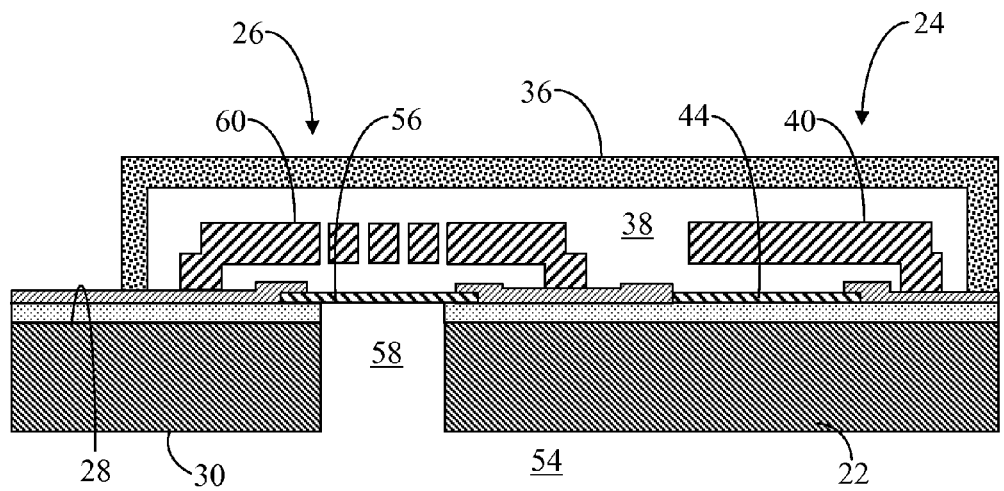
FIG. 10 shows a side view of the device of FIG. 9 in a subsequent stage of processing.

Referring to FIG. 10 in connection with activity 110, FIG. 10 shows a side view of the device of FIG. 9 in a subsequent stage 112 of processing. At stage 112, cap 36 is coupled with first side 28 of substrate 22. Activity 110 to attach cap 36 to substrate 22 may be accomplished using, for example, glass frit bonding, metal eutectic bonding, and the like.

With reference back to MEMS device fabrication process 66 (FIG. 2), following activity 110, process 66 may continue with other conventional fabrication activities. These additional fabrication activities, represented by an activity 114, may include packaging, forming electrical interconnects, such as external connection sites 64 (FIG. 1), testing, and so forth. Following fabrication of MEMS sensor device 20 (FIG. 1), fabrication process 66 ends with inertial sensor 24 and pressure sensor 26 concurrently formed on first side 28 of substrate 22 using existing, cost effective, MEMS fabrication operations to make both of inertial sensor 24 and pressure sensor 26, and with the added operation of creating cavity 58 on a back side of substrate 22 to expose diaphragm 56 to environment 54.

Figure 11:
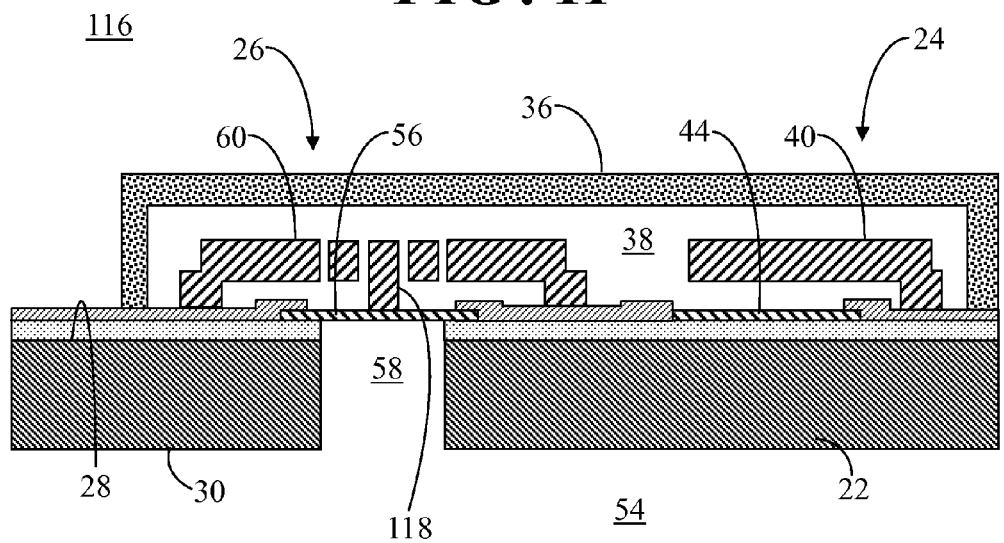
FIG. 11 shows a side view of a MEMS sensor device in accordance with another embodiment.

FIG. 11 shows a side view of a MEMS sensor device 116 in accordance with another embodiment. MEMS sensor device 116 is largely equivalent to MEMS sensor device 20 (FIG. 1). That is, MEMS sensor device 116 includes inertial sensor 24 having proof mass 40 and electrode element 44. Likewise, MEMS sensor device 116 includes pressure sensor 26 having diaphragm 56 exposed to environment 54 via cavity 58 and having reference element 60. Both inertial sensor 24 and pressure sensor 26 are located in hermetically sealed chamber 38 formed by the attachment of cap 36. Additional detailed discussion of the elements of MEMS sensor device 116 need not be repeated herein.

In this alternative embodiment, at least one support 118 is interposed between reference element 60 and the sense element, i.e., diaphragm 56. Support 118 is coupled to each of reference 60 and diaphragm 56. When diaphragm 56 is anchored only about an outer perimeter, as in MEMS sensor device 20, deflection of diaphragm 56 in response to pressure stimulus 52 (FIG. 1) may not be uniform across the surface of diaphragm 56. The inclusion of one or more supports 118 across the surface of diaphragm may produce more uniform deflection across the smaller areas of diaphragm 56 so as to yield better linearity. That is, diaphragm 56 may be formed relatively thin so as to allow its deflection. The inclusion of one or more supports, subdivides the relatively larger diaphragm 56 into a number of smaller diaphragms so as to get the desired deflection.

Referring to FIGS. 1 and 12, FIG. 12 shows a schematic illustration of MEMS sensor device 20 coupled with a control input/output circuit 120. Inertial sensor 24 and pressure sensor 26 typically require hermetically sealed chamber 38 to protect them from particles, moisture, and so forth. Pressure sensor 26 further requires hermetically sealed chamber 38 in order to measure the pressure difference between external environment 52 and the internal environment of chamber 38. The bonding, or fusion, of cap 36 with substrate 22 enables the formation of a common chamber 38 for both of inertial sensor 24 and pressure sensor 26.

Typical design requirements for pressure sensors, such as pressure sensor 26, call for an internal pressure of chamber 38 that is substantially lower than one atmosphere, for example, in the milliTorr range, where one atmosphere equals seven hundred and sixty Torr. However, the design requirements for a MEMS accelerometer, such as inertial sensor 24, typically call for a relatively high pressure, for example, one hundred to four hundred Torr, in order to have effective overload and mechanical performance.

The pressure inside the wafer bonder when coupling cap 36 with substrate 22 is typically controlled by a mechanical pump so that the pressure inside of chamber 38, once hermetically sealed, can vary from vacuum to over-pressure as needed by design. In order to address the differing design requirements called for by sensors that sense different physical stimuli, one of two techniques may be implemented. In one embodiment, chamber 38 is sealed under low pressure, i.e., vacuum. This configuration yields an underdamped inertial sensor 24 which can have mechanical stability problems. This stability issue can be addressed by incorporating a feedback control circuit that applies an electrostatic force so that proof mass 40 will stay in a nominal position.

In an alternative embodiment, chamber 38 may be sealed under higher pressure, i.e., greater than vacuum. Due to this configuration, the pressure inside chamber 38 will vary with temperature and external pressure which can lead to inaccurate pressure detection. This issue can be addressed by the incorporation of a correction circuit so that pressure sensor 26 can output accurate pressure readings without being influenced by changes in the pressure of chamber 38. In an embodiment, control input/output circuit 120 provides this correction circuit.

As illustrated in FIG. 12, inertial sensor 24 of MEMS sensor device 20 is in communication with suitable inertial sensor control input/output circuitry 122 to produce an acceleration signal 124. Suitable input/output circuitry 122 for inertial sensor 24 may entail capacitance-to-voltage conversion, analog-to-digital conversion, filtering, signal scaling, and the like as known to those skilled in the art.

Pressure sensor 26 is in communication with pressure sensor control input/output circuitry 126. Suitable pressure sensor input/output circuitry 126 for pressure sensor 26 may entail capacitance-to-voltage conversion, analog-to-digital conversion, filtering, signal scaling, and the like as known to those skilled in the art. Circuitry 126 may also include a specification compensation feature that compensates and scales for the normal electrical values called for by specification.

As discussed briefly above, chamber 38 may be sealed under relatively higher pressure. i.e., greater than vacuum. Due to this configuration, the pressure inside chamber 38 varies with temperature and external pressure which can lead to inaccurate pressure readings. Accordingly, pressure sensor input/output circuitry 126 further includes a correction circuit 128. Pressure sensor 26 produces a pressure output signal 130 indicative of external pressure stimulus 52. Pressure output signal 130 includes an error signal component that is responsive to the variable pressure inside chamber 38. Correction circuit 128 functions to largely eliminate the error signal component in order to produce a corrected pressure signal, $P_{corr}$, 132. This corrected pressure signal 132 may be further processed by conventional specification compensation to produce the appropriately compensated and scaled pressure signal, $P_{comp}$, 134.

Chamber pressure, $P_c$, of chamber 38 varies with temperature and external pressure, $P_{EXT}$, in accordance with the well known "gas law," $P_c V=nRT$. Where V is the volume of chamber 38, T is the temperature, and R is the gas constant. An equation 136 is derived by applying the gas law to the actual geometry of chamber 38. Equation 136 illustrates that the variation of chamber pressure, $P_c$, can be described in polynomial functions which can be trimmed or adjusted by a polynomial trim algorithm that encompasses equation 136 in correction circuit 126. Thus, correction circuit 126 makes adjustments for temperature variation (linear) and external pressure effect (second order) to produce corrected pressure, $P_{corr}$, 132 as a difference between the external pressure, $P_{EXT}$, and the actual chamber pressure, $P_c$, computed through the execution of equation 136. As a result, through the incorporation of correction circuit 128, pressure sensor 26 can output accurate pressure readings without being influenced by changes in temperature and chamber pressure. Correction circuit 128 may be formed as hardware, software, or a combination of hardware and software.

An embodiment described herein comprises a compact MEMS sensor device that includes at least two sensors in a laterally integrated configuration capable of sensing different physical stimuli, such as motion and pressure. The sensors are disposed on the same side of a substrate and can be concurrently fabricated using MEMS technology processes. Following fabrication on the substrate, a backside cavity can be formed through the substrate to expose a movable portion of one of the sensors to an external environment. The laterally spaced integration of the sensors results in the effective use of die area, the efficient production of a hermetically sealed chamber, and the implementation of low cost MEMS batch processing. In addition, the MEMS sensor device achieves the additional advantages of good performance, small size, and low power consumption. Furthermore, the integration of two different sensors into a single package allows the sensors to benefit from the same package stress relief, such as through the application of low stiffness module coating materials.

Although the preferred embodiments of the invention have been illustrated and described in detail, it will be readily apparent to those skilled in the art that various modifications may be made therein without departing from the spirit of the invention or from the scope of the appended claims. For example, although the described MEMS sensor device includes a single inertial sensor and a single pressure sensor, in alternative embodiments, a MEMS sensor device may have additional laterally and vertically integrated sensors, with one or more of the sensors including a backside cavity.

What is claimed is:

1. A microelectromechanical systems (MEMS) sensor device comprising:
    a substrate having a first side and a second side that opposes said first side;
    a first sensor disposed on said first side of said substrate at a first location;
    a second sensor disposed on said first side of said substrate at a second location, said second sensor including a sense element, and said substrate including a cavity at said second location and extending through said substrate from said second side to expose said sense element to an environment external to said MEMS sensor device; and
    a cap coupled with said first side of said substrate to form a hermetically sealed chamber in which both of said first sensor and said second sensor are located.

2. A MEMS sensor device as claimed in claim 1 wherein said second sensor comprises a pressure sensor, and said sense element is a diaphragm that is movable in response to a pressure stimulus from said environment.

3. A MEMS sensor device as claimed in claim 2 wherein said first sensor comprises an inertial sensor configured to sense a motion stimulus.

4. A MEMS sensor device as claimed in claim 1 wherein:
    said hermetically sealed chamber exhibits a chamber pressure that is variable in response to an ambient temperature and said pressure stimulus;

said second sensor is a pressure sensor and said sense element is a diaphragm that is moveable in response to said pressure stimulus to produce a pressure output signal; and said MEMS sensor device further comprises a correction circuit in communication with said pressure sensor for receiving said pressure output signal and producing a corrected pressure signal to compensate for an error signal component in said pressure output signal.

5. A MEMS sensor device as claimed in claim 1 wherein:
said sense element is configured to move in a direction perpendicular to said first side of said substrate; and
said second sensor further includes an over-travel stop structure spaced apart from said first side and overlying said sense element, said over-travel stop structure being adapted to limit movement of said sense element in said direction perpendicular to said first side of said substrate.

6. A MEMS sensor device as claimed in claim 1 wherein:
said sense element is configured to move in a direction perpendicular to said first side of said substrate; and
said second sensor further includes a reference element spaced apart from said first side and overlying said sense element, said second sensor being adapted to sense a physical stimulus from said environment as movement of said sense element relative to said reference element in said direction.

7. A MEMS sensor device as claimed in claim 6 wherein said reference element comprises an over-travel stop adapted to limit movement of said sense element in said direction perpendicular to said first side of said substrate.

8. A MEMS sensor device as claimed in claim 6 further comprising a support interposed between said reference element and said sense element and coupled to each of said reference element and said sense element.

9. A MEMS sensor device as claimed in claim 6 wherein said first sensor comprises a movable element in movable communication with said first side of said substrate, said reference element and said movable element being concurrently formed from a common material layer.

10. A MEMS sensor device as claimed in claim 1 wherein said first sensor comprises an electrode element disposed on said first side of said substrate at said first location, said sense element and said electrode element being concurrently formed on said first side from a common material layer.

11. A MEMS sensor device as claimed in claim 1 wherein each of said first and second sensors is a capacitive sensor.

12. A method of producing a microelectromechanical systems (MEMS) sensor device comprising:
concurrently forming an electrode element and a sense element from a first material layer on a first side of a substrate, said electrode element positioned at a first location on said first side and said sense element laterally spaced apart from said electrode element and positioned at a second location on said first side;
concurrently forming a movable element and a reference element spaced apart from said first side of said substrate, said movable element and said reference element being formed from a second material layer, said movable element functioning cooperatively with said electrode element to produce a first sensor, and said reference element overlying said sense element to produce a second sensor; and
creating a cavity at said second location extending through said substrate from a second side of said substrate to expose said sense element to an environment external to said sensor system.

13. A method as claimed in claim 12 wherein:
said forming said electrode element and said sense element include depositing said first material layer over said first side of said substrate and selectively etching said first material layer to produce said electrode element and said sense element; and
said forming said movable element and said reference element includes depositing a sacrificial layer over said electrode element and said sense element, selectively etching said sacrificial layer, depositing said second material layer over said sacrificial layer, selectively etching said second material layer to produce said movable element and said reference element, and removing said sacrificial layer to form respective first and second sensors.

14. A method as claimed in claim 12 further comprising coupling a cap to said first side of said substrate to form a hermetically sealed chamber in which both of said first sensor and said second sensor are located.

15. A method as claimed in claim 14 wherein:
said first sensor comprises an inertial sensor and said movable element moves relative to said electrode element in response to a motion stimulus; and
said second sensor comprises a pressure sensor and said sense element moves relative to said reference element in response to a pressure stimulus from said environment.

16. A microelectromechanical systems (MEMS) sensor device comprising:
a substrate having a first side and a second side that opposes said first side;
a first sensor disposed on said first side at a first location;
a second sensor disposed on said first side at a second location, said second sensor comprising a pressure sensor having a diaphragm, and said substrate including a cavity at said second location, said cavity extending through said substrate from said second side to expose said diaphragm to an environment external to said MEMS sensor device, and said diaphragm being movable in response to a pressure stimulus from said environment; and
a cap coupled with said first side of said substrate to form a hermetically sealed chamber in which both of said first sensor and said pressure sensor are located.

17. A MEMS sensor device as claimed in claim 16 wherein:
said diaphragm is configured to move in a direction perpendicular to said first side of said substrate; and
said pressure sensor further includes a reference element spaced apart from said first side and overlying said diaphragm, said pressure sensor being adapted to sense said pressure stimulus from said environment as movement of said diaphragm relative to said reference element in said direction.

18. A MEMS sensor device as claimed in claim 17 wherein said first sensor comprises a movable element in movable communication with said first side of said substrate, said reference element and said movable element being concurrently formed from a common material layer.

19. A MEMS sensor device as claimed in claim 16 wherein said first sensor comprises an electrode element disposed on said first side of said substrate at said first location, said diaphragm and said electrode element being concurrently formed on said first side from a common material layer.

* * * * *